(12) United States Patent
Chen

(10) Patent No.: US 7,678,606 B2
(45) Date of Patent: Mar. 16, 2010

(54) PHASE CHANGE MEMORY DEVICE AND FABRICATION METHOD THEREOF

(75) Inventor: Frederick T Chen, Hsinchu (TW)

(73) Assignees: Industrial Technology Research Institute, Hsinchu (TW); Powerchip Semiconductor Corp., Hsin-Chu (TW); Nanya Technology Corporation, Taoyuan (TW); ProMOS Technologies Inc., Hsinchu (TW); Winbond Electronics Corp., Hsinchu (TW)

( * ) Notice: Subject to any disclaimer, the term of this patent is extended or adjusted under 35 U.S.C. 154(b) by 153 days.

(21) Appl. No.: 11/850,019

(22) Filed: Sep. 4, 2007

(65) Prior Publication Data

US 2009/0057643 A1    Mar. 5, 2009

(51) Int. Cl.
*H01L 21/06* (2006.01)
(52) U.S. Cl. ............... 438/102; 257/4; 257/E45.002
(58) Field of Classification Search .............. 257/4, 257/E45.002; 438/102
See application file for complete search history.

(56) References Cited

U.S. PATENT DOCUMENTS

| | | | |
|---|---|---|---|
| 6,864,503 B2 | 3/2005 | Lung | |
| 6,867,425 B2 | 3/2005 | Wicker | |
| 6,972,428 B2 | 12/2005 | Maimon | |
| 7,092,286 B2 | 8/2006 | Lowrey et al. | |
| 7,119,353 B2 | 10/2006 | Lankhorst et al. | |
| 7,138,687 B2 | 11/2006 | Lung et al. | |
| 7,173,271 B2 | 2/2007 | Chang | |
| 7,183,567 B2 | 2/2007 | Chiang | |
| 2006/0284159 A1* | 12/2006 | Chang et al. | 257/3 |
| 2007/0272950 A1* | 11/2007 | Kim et al. | 257/211 |
| 2008/0081473 A1* | 4/2008 | Suzuki | 438/687 |
| 2008/0272355 A1* | 11/2008 | Cho et al. | 257/2 |
| 2008/0308782 A1* | 12/2008 | Shue et al. | 257/2 |

* cited by examiner

*Primary Examiner*—Bradley K Smith
*Assistant Examiner*—Marvin Payen
(74) *Attorney, Agent, or Firm*—Quintero Law Office

(57) ABSTRACT

A phase change memory device is disclosed. A second conductive spacer is under a first conductive spacer. A phase change layer comprises a first portion substantially parallel to the first and second conductive spacers and a second portion on top of the second conductive spacer, wherein the second conductive spacer is electrically connected to the first conductive spacer through the second portion of the phase change layer.

12 Claims, 6 Drawing Sheets

PHASE CHANGE MEMORY DEVICE AND FABRICATION METHOD THEREOF

BACKGROUND OF THE INVENTION

1. Field of the Invention

The invention relates to a memory device and fabrication thereof, and more particularly relates to a phase change memory device and fabrication thereof.

2. Description of the Related Art

Phase change memory devices have many advantages, such as high speed, lower power consumption, large capacity, greater endurance, better process integrity and lower cost. Phase change memory devices can thus be used as independent or embedded memory devices with high data integrity. Due to the described advantages and others, phase change memory device may replace flash memory.

To serve as a viable alternative, phase change memory technology requires highly reliable, high-speed, low-current, low-voltage operation. Current phase change memory technology employs heating at the interface between a metal electrode contact and the phase change material. This heating method is highly inefficient, however, and requires a lengthy programming duration of up to several hundred nanoseconds, and may also require a substantial amount of current (0.5 mA or greater). The described inefficient heating is also characterized by non-uniform temperature distribution within the phase change region, diminishing reliability due to accumulation of incomplete phase change in the programming volume. It is thus desirable to devise a phase change memory cell structure design that avoids these disadvantages.

BRIEF SUMMARY OF INVENTION

A detailed description is given in the following embodiments with reference to the accompanying drawings. These and other problems are generally solved or circumvented, and technical advantages are generally achieved, by the invention.

The invention provides a phase change memory device. A first conductive spacer is provided. A second conductive spacer is under the first conductive spacer. A phase change layer comprises a first portion substantially parallel to the first and second conductive spacers, and a second portion on top of the second conductive spacer, wherein the second conductive spacer is electrically connected to the first conductive spacer through the second portion of the phase change layer.

The invention provides a phase change memory device. A first dielectric layer contains a first opening. A second opening is provided under the first opening. The width of first opening is greater than the width of the second opening. A first conductive spacer is on a sidewall of the first opening. A second conductive spacer is on a sidewall of the second opening. A first dielectric spacer is optionally adjacent to the first conductive spacer. A second dielectric spacer is optionally adjacent to the second conductive spacer. A phase change layer fills both openings and is electrically coupled in parallel with the first conductive layer and covers the top of the second conductive spacer. A dielectric layer is optionally deposited on the phase change layer.

The invention provides a method for forming a phase change memory device. In an exemplary embodiment of the method, a first dielectric layer is first formed on a bottom electrode. The first dielectric layer is patterned to form a first opening. The dielectric layer is patterned to form a second opening under the first opening, expanding the first opening in the process. A conductive-spacer layer is formed on the first dielectric layer and in the first and second openings. A dielectric-spacer layer is optionally formed on the conductive-spacer layer. The conductive-spacer layer and the optional dielectric-spacer layer are anisotropically etched. A phase change layer is conformally deposited in the first and second opening. An additional dielectric layer is optionally formed on the phase change layer.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1A:
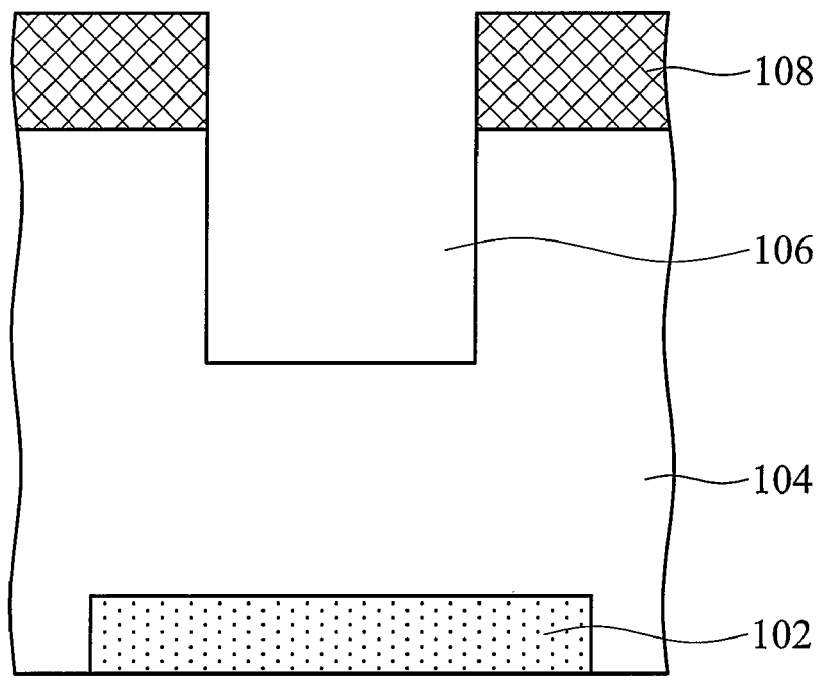
FIG. 1A~FIG. 1J show intermediate cross sections of fabrications of a phase change memory device of an embodiment of the invention.

The following description is of the contemplated mode of carrying out the invention. This description is made for the purpose of illustrating the general principles of the invention and should not be taken in a limiting sense. The scope of the invention is best determined by reference to the appended claims. Embodiments of the invention, which provides a phase change memory device, will be described in greater detail by referring to the drawings that accompany the invention. It is noted that in the accompanying drawings, like and/or corresponding elements are referred to by like reference numerals.

The dominant electrical resistance component in a phase change memory cell is the phase change material itself or an external heater. An external heater component is undesirable due to the poor thermal uniformity thereof (temperature decreases with distance from the heater). Thus, an embodiment of the invention uses the phase change material to be the dominant electrical resistance. In order to reduce both programming current and voltage, the phase change volume must be minimized. Additionally, to minimize non-uniform heating the phase change volume should not be in direct contact with an effective heat sink path. This is achieved by imposing a lateral offset between the top and bottom metal contacts and the phase change material of an embodiment of the invention; thus, thermal resistance is increased in the heat loss path.

FIG. 1A~FIG. 1J show intermediate cross sections of fabrications of a phase change memory device of an embodiment of the invention. First, referring to FIG. 1A, a first dielectric layer 104, such as oxide, is deposited on a bottom electrode 102, such as W or TiAlN. The bottom electrode 102 could be one terminal of a transistor or a diode. A photoresist layer is coated on the first dielectric layer 104 and then defined by lithography to constitute a photoresist pattern 108. Thereafter, the first dielectric layer 104 is etched using the photoresist pattern 108 as a mask to form a first opening 106, partially through the first dielectric layer 104, for a time shorter than that required for completely penetrating the first dielectric layer 104. An etch stop layer (not shown) may alternatively be used.

Figure 1B:
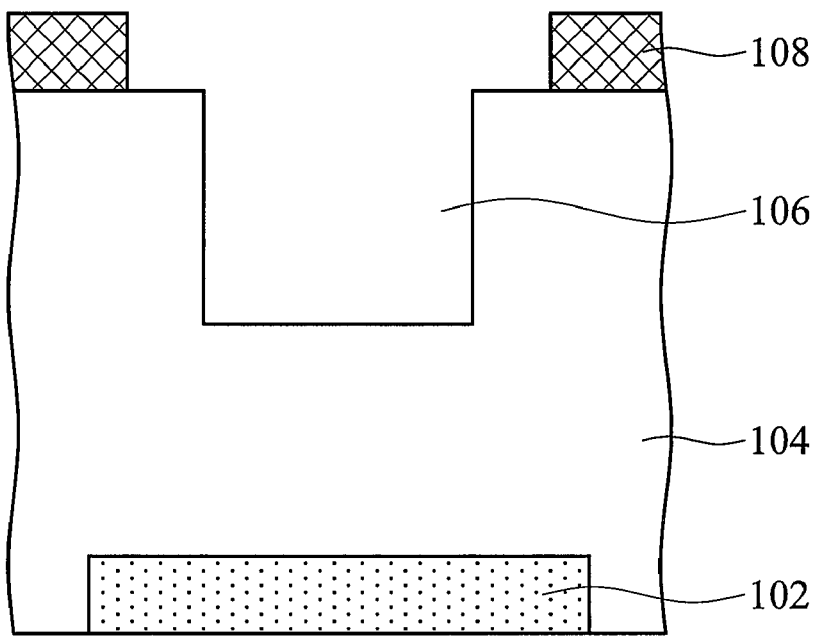

Referring to FIG. 1B, the photoresist pattern 108 is trimmed, for example, about 10-15 nm is removed laterally from each side of the first opening 106. In an embodiment of the invention, the trimming of the photoresist pattern 108 uses oxygen plasma.

Figure 1C:
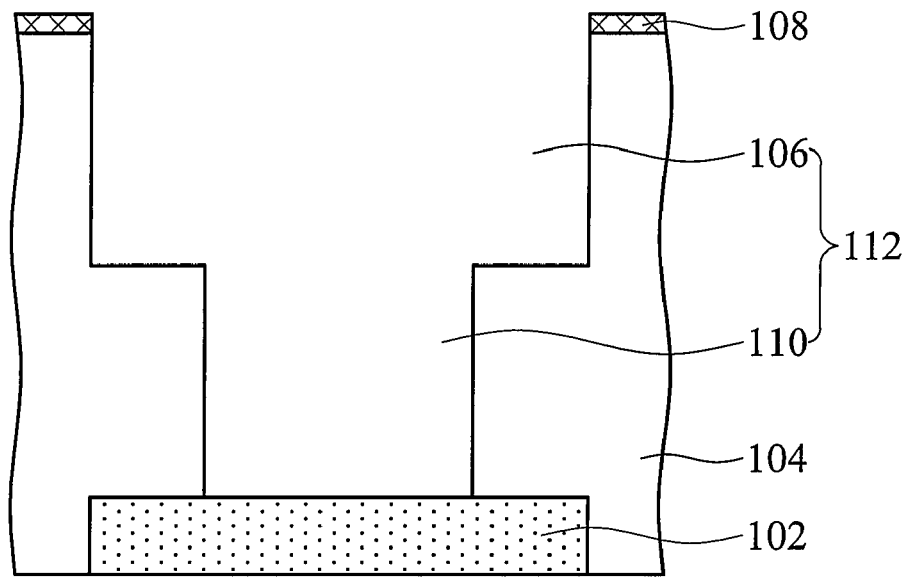

Referring to FIG. 1C, after the trimming process, the first dielectric layer 104 (and optional etch-stop) is again etched, until the bottom electrode 102 is exposed. The etching may be anisotropic etching. A two-level opening structure 112, comprising a first opening 106, and a second opening 110, is thus obtained by self-aligned etching. As shown in the figure, the second opening 110 is under the first opening 106, and the width of the first opening 106 is greater than the width of the second opening 110.

Figure 1D:
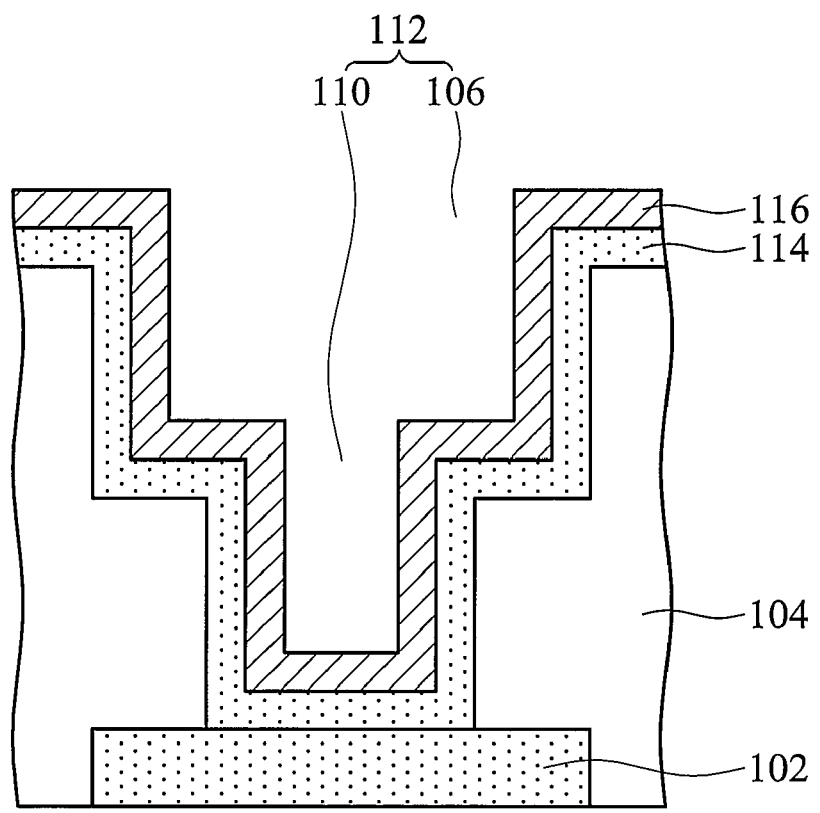

Referring to FIG. 1D, a conductive-spacer layer 114 is conformally deposited (e.g., by PVD or ALD) on the first dielectric layer 104 and into the opening. Specifically, the conductive-spacer layer 114 covers sidewalls of the first and second openings 106 and 110. In an embodiment of the invention, the conductive-spacer layer 114 is TaN or TiN, and may be about 2-10 nm. When forming conductive spacers, adequately flat contacts at the conductive-spacer layer 114 are required to be provided at the contact surface. Therefore, in one embodiment of the invention, a dielectric-spacer layer 116, such as CVD oxide, may be deposited on the conductive-spacer layer 114.

Figure 1E:
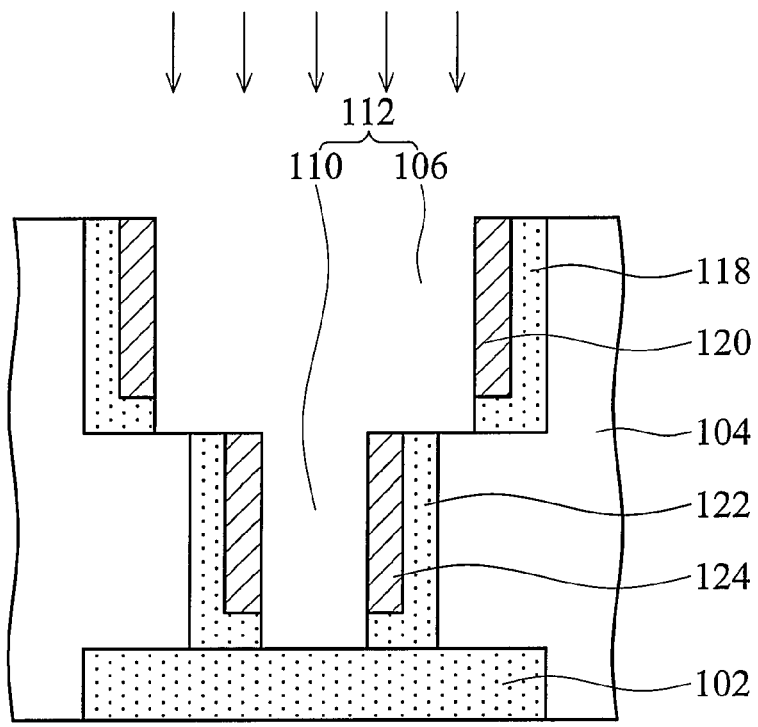

Referring to FIG. 1E, the conductive-spacer layer 114 and the dielectric-spacer layer 116 are etched anisotropically, in which the horizontal portions thereof can be substantially removed. The conditions of the etching process are fine tuned to have a substantially close etching rate and selectivity between the conductive-spacer layer 114 and the dielectric-spacer layer 116. Note that the process steps described constitute a specific structure. As shown in FIG. 1E, an adjacent second conductive spacer 122 and second dielectric spacer 124 pair is under an adjacent first conductive spacer 118 and a first dielectric spacer 120 pair, wherein the second conductive spacer 122 and second dielectric spacer 124 pair is not connected to the adjacent first conductive spacer 118 and first dielectric spacer 120 pair.

Figure 1F:
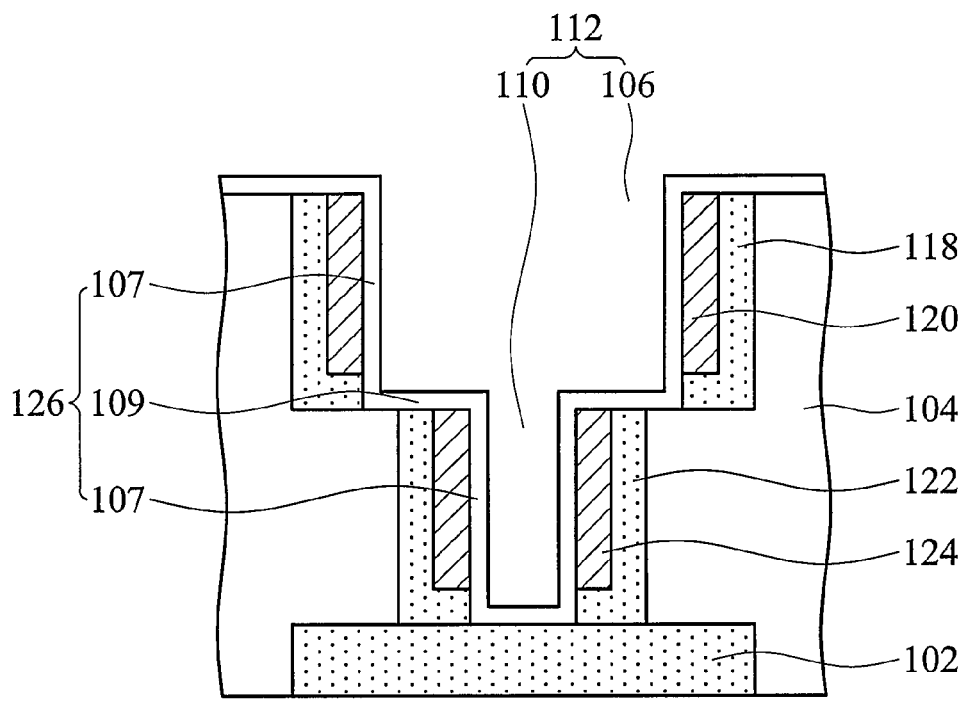

Referring to FIG. 1F, a phase change layer 126 is then deposited by, for example, PVD, CVD or ALD, to cover conductive spacers 118 and 122, and dielectric spacers 120 and 124. In an embodiment of the invention, the deposited phase change layer 126 is a layer about 1-3 nm thick. The phase change layer 126 can comprise a chalcogenide compound, for example, a chalcogenide compound comprising Ge—Te—Sb, GeSb, or SbTe. As shown in FIG. 1F, the phase change layer 126 comprises a vertical portion 107 on sidewalls of the first and second dielectric spacers 120 and 124, and a horizontal portion 109 on top of the second dielectric and conductive spacers 122 and 124. As well, the vertical portion 107 and the horizontal portion 109 of the phase change layer 126 are substantially perpendicular. The bottom electrode 102 may be partially etched during the conductive spacer etching process; this however is inconsequential as that portion of the electrode is not in the current path.

Figure 1G:
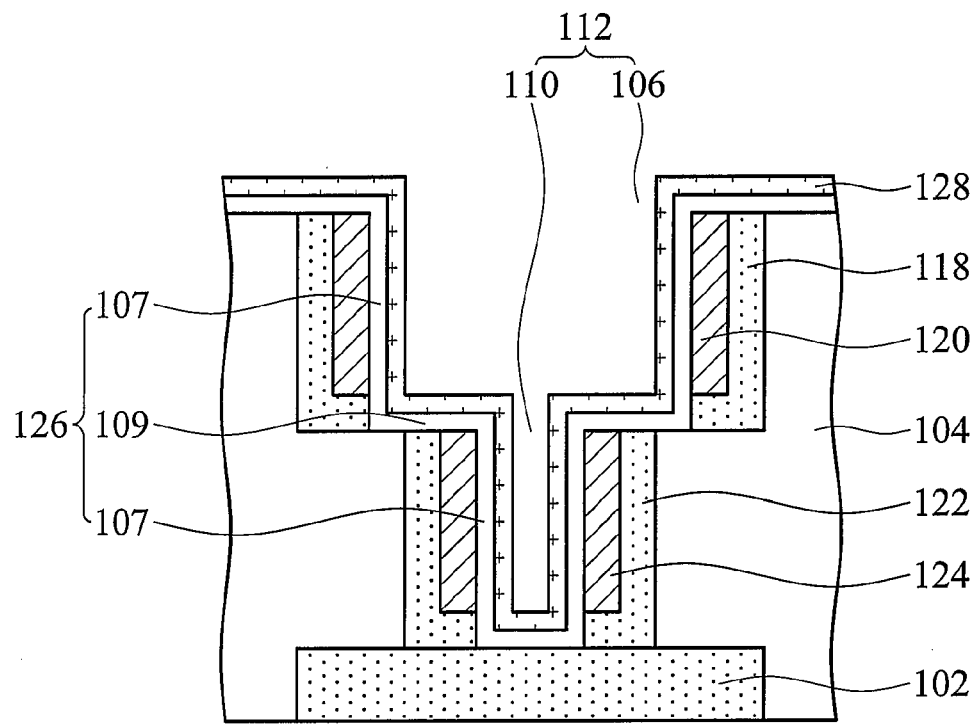

In FIG. 1G, the same tool used for deposition of the phase change layer 126 can optionally deposit a protective layer 128. The protective layer 128 may be an oxide such as zirconium oxide or tantalum oxide and may serve the dual purpose of protecting the phase change layer 126 from oxidation after removal from the deposition tool, and reduction of void formation during program cycling.

Figure 1H:
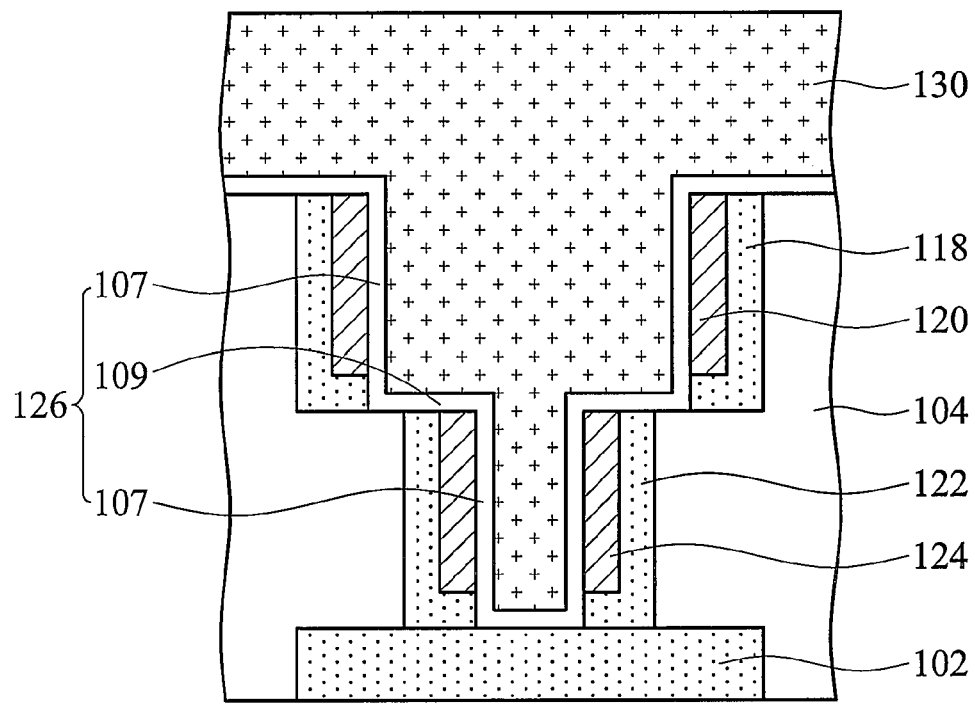
Figure 1I:
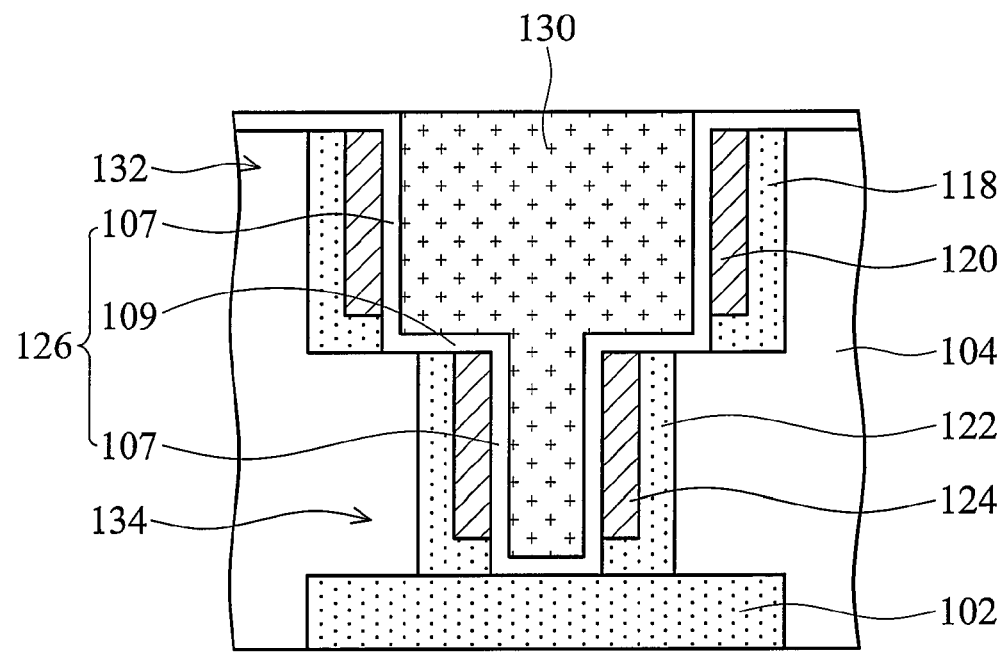

Referring to FIG. 1H, a second dielectric layer 130 is deposited, by CVD, for example, on the phase change layer 126. The first opening 106 is filled with layers to constitute a first via 132, and the second opening 110 is filled with layers to constitute a second via 134. (The labels 106 and 110 are shown in FIG. 1G only.) In FIG. 1I, the second dielectric layer 130 is then planarized, by CMP for example, to present a planar surface and remove unnecessary portions. Note that a portion of phase change layer 126 beyond the first and second openings 106 and 110 may be removed by the planarization with no effect as the removed portion is not critical.

Figure 1J:
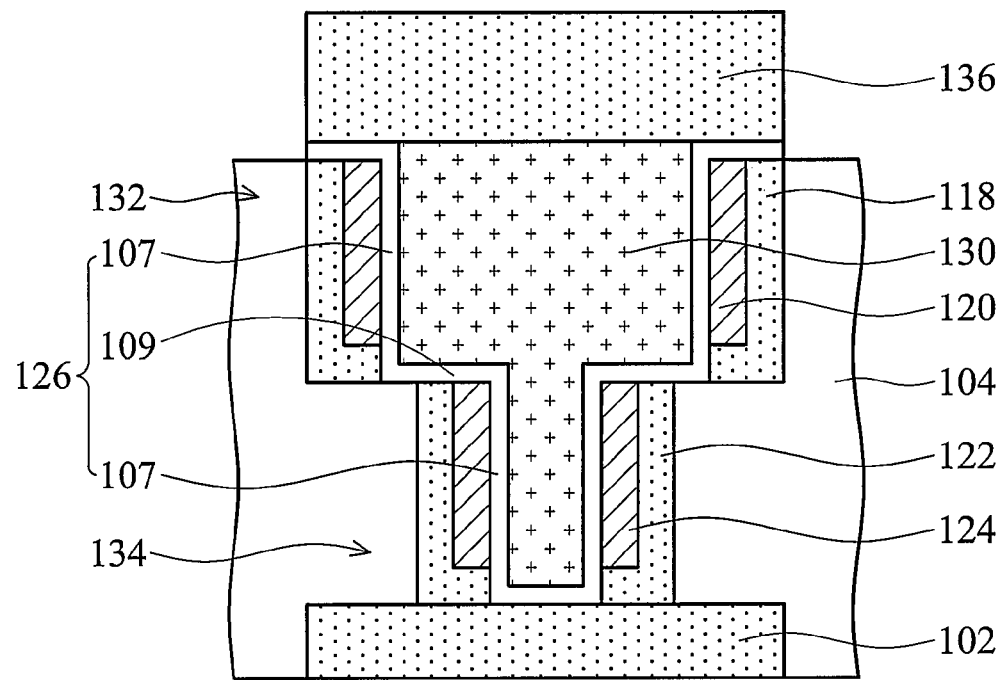

FIG. 1J shows deposition of the top electrode 136, such as W or TiAlN, and subsequent patterning by lithography and etching, to remove a portion of the phase change layer 126 remaining on the top surface of the first dielectric layer 104. In another embodiment of the invention, the top electrode 136 may electrically connect with the first conductive spacer 118.

Figure 1K:
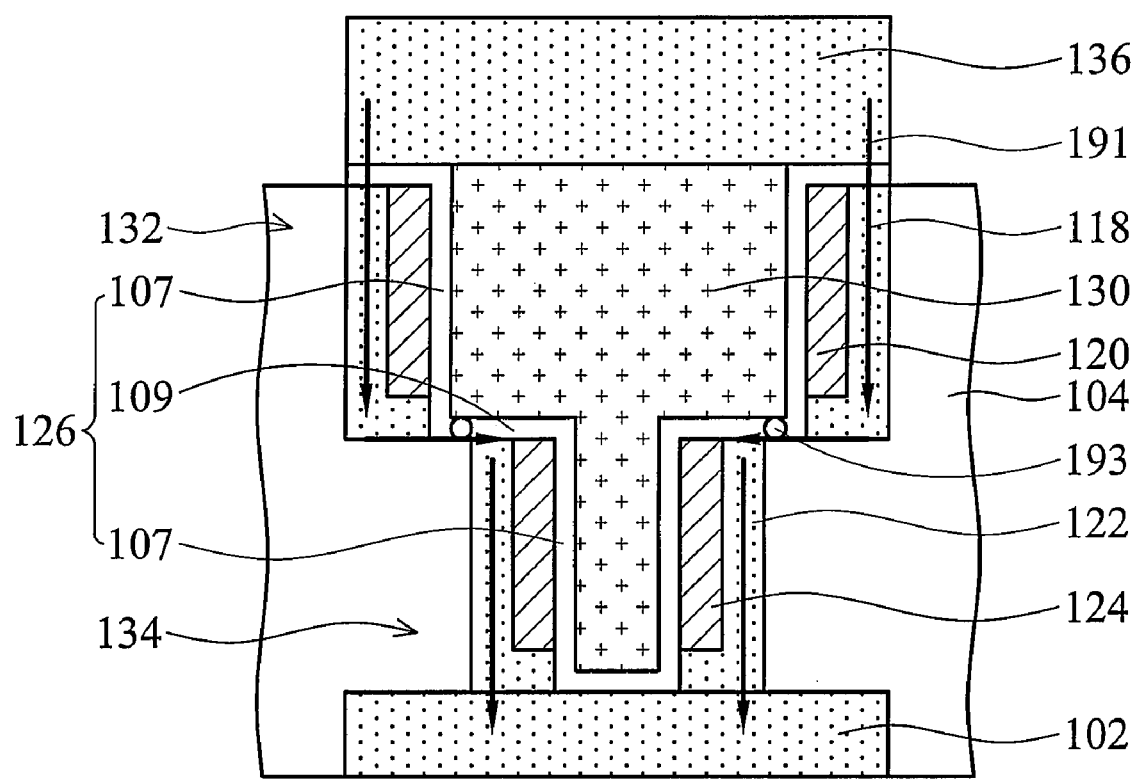
FIG. 1K shows an operating mechanism of the phase change memory device of an embodiment of the invention.

FIG. 1K shows an operating mechanism of the phase change memory device of an embodiment of the invention. Although the phase change layer 126 contacts the electrode, because it is very thin, current 191 will overwhelmingly go through the conductive spacer contacts 118 and 122. Note that the active region 193 will be in the horizontal portion 109 of the phase change layer 126 between the top of the second conductive spacer contact 122 and the foot of the first conductive spacer contact 118. The effective heating cross-section area is thus the product of the thickness of the phase change layer 126 and the circumference of the second via 134. The effective phase change length is the distance between the top of the second conductive spacer 122 and the foot of the first conductive spacer 118.

According to one of the embodiments described, the structure of the invention allows simultaneous reduction of current and voltage and thermal non-uniformity in the programming region of the phase change memory device. In addition, the fabrication process flow is simple, and, alignment is not a critical issue with the proposed self-aligned process.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase change memory device, comprising:
    a first dielectric layer comprising a first opening and a second opening under the first opening, wherein width of first opening is greater than the width of the second opening;
    a first conductive spacer on a sidewall of the first opening;
    a second conductive spacer on a sidewall of the second opening;
    a phase change layer at least covering sidewalls of the first and second conductive spacers and top of the second conductive spacer; and
    a second dielectric layer on the phase change layer,
    wherein each of the first conductive spacer and the second conductive spacer is L shaped and includes a vertical portion and a horizontal portion, the vertical portion is separated from the phase change layer by a dielectric spacer, and the horizontal portion contacts the phase change layer.

2. The phase change memory device as claimed in claim 1, wherein the first and second openings expose a bottom electrode.

3. The phase change memory device as claimed in claim 1, wherein the first conductive spacer and the second conductive spacer are electrically connected through a portion of the phase change layer on top of the second conductive spacer.

4. The method for forming a phase change memory device as claimed in claim 3, wherein an active region of the phase change memory device is disposed in the portion of the phase change layer.

5. A method for forming a phase change memory device, comprising:
    forming a first dielectric layer on a bottom electrode;
    patterning the first dielectric layer to form a first opening;
    expanding the first opening;
    patterning the first dielectric layer to form a second opening under the first opening;
    forming a conductive-spacer layer on the first dielectric layer and in the first and second openings;
    forming a dielectric-spacer layer on the conductive-spacer layer;
    anisotropically etching the conductive-spacer layer and the dielectric-spacer layer to form a first conductive spacer on a sidewall of the first opening, a second conductive spacer on a sidewall of the second opening, a first dielectric spacer adjacent to the first conductive spacer and a second dielectric spacer adjacent to the second conductive spacer;
    conformally depositing a phase change layer in the first and second opening; and
    forming a second dielectric layer on the phase change layer,
    wherein each of the first conductive spacer and the second conductive spacer is L shaped and includes a vertical portion and a horizontal portion, the vertical portion is separated from the phase change layer by one of the first and second dielectric spacers, and the horizontal portion contacts the phase change layer.

6. The method for forming a phase change memory device as claimed in claim 5, wherein anisotropically etching the conductive-spacer layer and anisotropically etching the dielectric-spacer layer are accomplished in the same etching step.

7. The method for forming a phase change memory device as claimed in claim 5, wherein expanding the first opening and forming the second opening are accomplished by a single self-aligned etching process.

8. The method for forming a phase change memory device as claimed in claim 7, wherein the single self-aligned etching process is anisotropic etching.

9. The method for forming a phase change memory device as claimed in claim 5, further comprising in-situ deposition of a protective layer on the phase change layer before forming the second dielectric layer.

10. The method for forming a phase change memory device as claimed in claim 5, further comprising planarizing the second dielectric layer.

11. The method for forming a phase change memory device as claimed in claim 5, further comprising forming a top electrode on the second dielectric layer.

12. The phase change memory device as claimed in claim 1, wherein the vertical portion of the first conductive spacer contacts a first horizontal portion of the phase change layer, the horizontal portion of the first conductive spacer contacts a first vertical portion of the phase change layer, the vertical portion of the second conductive spacer contacts a second horizontal portion of the phase change layer, and the horizontal portion of the second conductive spacer contacts a second vertical portion of the phase change layer.

* * * * *